(12) United States Patent
Wu et al.

(10) Patent No.: US 9,238,581 B2
(45) Date of Patent: Jan. 19, 2016

(54) TRIPLE-AXIS MEMS ACCELEROMETER

(71) Applicant: Taiwan Semiconductor Manufacturing Company, Ltd., Hsin-Chu (TW)

(72) Inventors: Ting-Hau Wu, Yilan (TW); Chun-Ren Cheng, Hsin-Chu (TW); Shang-Ying Tsai, Pingzhen (TW); Jiou-Kang Lee, Zhu-Bei (TW); Jung-Huei Peng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 196 days.

(21) Appl. No.: 13/752,051

(22) Filed: Jan. 28, 2013

(65) Prior Publication Data

US 2014/0024160 A1 Jan. 23, 2014

Related U.S. Application Data

(63) Continuation of application No. 12/751,598, filed on Mar. 31, 2010, now Pat. No. 8,362,578.

(60) Provisional application No. 61/183,434, filed on Jun. 2, 2009.

(51) Int. Cl.
*B81C 1/00* (2006.01)
*G01P 15/125* (2006.01)
*G01P 15/18* (2013.01)

(52) U.S. Cl.
CPC ........... *B81C 1/00134* (2013.01); *G01P 15/125* (2013.01); *G01P 15/18* (2013.01)

(58) Field of Classification Search
CPC .............. B81C 1/00134; B81C 1/0015; B81C 1/00158; B81C 2203/00; H01L 2924/1461
USPC ................................................ 438/50, 52, 53
See application file for complete search history.

(56) References Cited

U.S. PATENT DOCUMENTS 6,027,630 A * 2/2000 Cohen ........................... 205/135
7,346,178 B2 3/2008 Zhe et al.
(Continued)

FOREIGN PATENT DOCUMENTS

WO WO 90/10843 9/1990

OTHER PUBLICATIONS

Qu, H., et al., "A Single-Crystal Silicon 3-Axis CMOS-MEMS Accelerometer," IEEE Sensors 2004, Vienna, Austria, Oct. 2004, 4 pages.

*Primary Examiner* — Daniel Whalen
*Assistant Examiner* — Suberr Chi
(74) *Attorney, Agent, or Firm* — Slater & Matsil, L.L.P.

(57) ABSTRACT

An integrated circuit structure includes a triple-axis accelerometer, which further includes a proof-mass formed of a semiconductor material; a first spring formed of the semiconductor material and connected to the proof-mass, wherein the first spring is configured to allow the proof-mass to move in a first direction in a plane; and a second spring formed of the semiconductor material and connected to the proof-mass. The second spring is configured to allow the proof-mass to move in a second direction in the plane and perpendicular to the first direction. The triple-axis accelerometer further includes a conductive capacitor plate including a portion directly over, and spaced apart from, the proof-mass, wherein the conductive capacitor plate and the proof-mass form a capacitor; an anchor electrode contacting a semiconductor region; and a transition region connecting the anchor electrode and the conductive capacitor plate, wherein the transition region is slanted.

20 Claims, 10 Drawing Sheets

(56) References Cited

U.S. PATENT DOCUMENTS

| | | | |
|---|---|---|---|
| 2004/0222468 A1* | 11/2004 | DCamp et al. | 257/355 |
| 2005/0221529 A1* | 10/2005 | Bang et al. | 438/53 |
| 2006/0144143 A1 | 7/2006 | Gogoi et al. | |
| 2008/0142914 A1* | 6/2008 | Diamond | B81C 1/00246 257/415 |

* cited by examiner

TRIPLE-AXIS MEMS ACCELEROMETER

This application is a continuation of U.S. patent Ser. No. 12/751,598, filed Mar. 31, 2010, entitled "Triple-Axis MEMS Accelerometer," which application further claims priority to and claims the benefit of U.S. Provisional Application No. 61/183,434 filed on Jun. 2, 2009, entitled "Triple-Axis MEMS Accelerometer," which applications are hereby incorporated herein by reference.

TECHNICAL FIELD

This invention relates generally to integrated circuit structures and manufacturing processes, and more particularly to micro-electro-mechanical system (MEMS) accelerometers, and even more particularly to triple-axis accelerometers.

BACKGROUND

Accelerometers may be used to detect the acceleration rate of moving objects, such as cars, airplanes, or the like. FIG. 1A illustrates a top view of a convention single-axis accelerometer 100. A cross-sectional view of accelerometer 100 is shown in FIG. 1B, wherein the cross-sectional view is taken along a plane crossing line 1B-1B in FIG. 1A. In the center of accelerometer 100, there is proof-mass 102 that has a relatively great mass. Springs 104 support proof-mass 102 (also refer to FIG. 1B), and allow proof-mass 102 to move in the x directions (either +x or −x directions). Proof-mass 102 is supported by springs 104. Proof-mass 102 and conductive components 108 are both conductive, and hence form capacitors. If accelerometer 100 does not experience acceleration, proof-mass 102 is located at a balance point. When accelerometer 100 does experience acceleration in one of the +x and −x directions, proof-mass 102 will move to the direction opposite to the acceleration direction. The capacitance between proof-mass 102 and conductive components 108 changes accordingly. By measuring the change in the capacitance, the acceleration rate and the acceleration direction (+x direction or −x direction) may be calculated.

FIG. 2 illustrates a top view of a double-axis accelerometer, which may move in both x (+x and −x) directions and y (+y and −y) directions. The mechanism is similar to the mechanism of the single-axis accelerometer, except the springs are also formed in the y directions (+y and −y directions), and the corresponding capacitances reflecting the movement of proof-mass 102 in the y directions is also measured.

SUMMARY OF THE INVENTION

In accordance with one aspect of the present invention, An integrated circuit structure includes a triple-axis accelerometer, which further includes a proof-mass formed of a semiconductor material; a first spring formed of the semiconductor material and connected to the proof-mass, wherein the first spring is configured to allow the proof-mass to move in a first direction in a plane; and a second spring formed of the semiconductor material and connected to the proof-mass. The second spring is configured to allow the proof-mass to move in a second direction in the plane and perpendicular to the first direction. The triple-axis accelerometer further includes a conductive capacitor plate including a portion directly over, and spaced apart from, the proof-mass, wherein the conductive capacitor plate and the proof-mass form a capacitor; an anchor electrode contacting a semiconductor region; and a transition region connecting the anchor electrode and the conductive capacitor plate, wherein the transition region is slanted.

Other embodiments are also disclosed.

The advantageous features of the present invention include increased sensitivity in the detection of the acceleration in z-directions, improved reliability, and increased resistance to cracking in the conductive capacitor plate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention and do not limit the scope of the invention.

A novel triple-axis accelerometer and the method of forming the same are presented. The intermediate stages of manufacturing an embodiment of the present invention are illustrated. The variations and the operation of the embodiment are then discussed. Throughout the various views and illustrative embodiments of the present invention, like reference numbers are used to designate like elements.

Figure 1A:
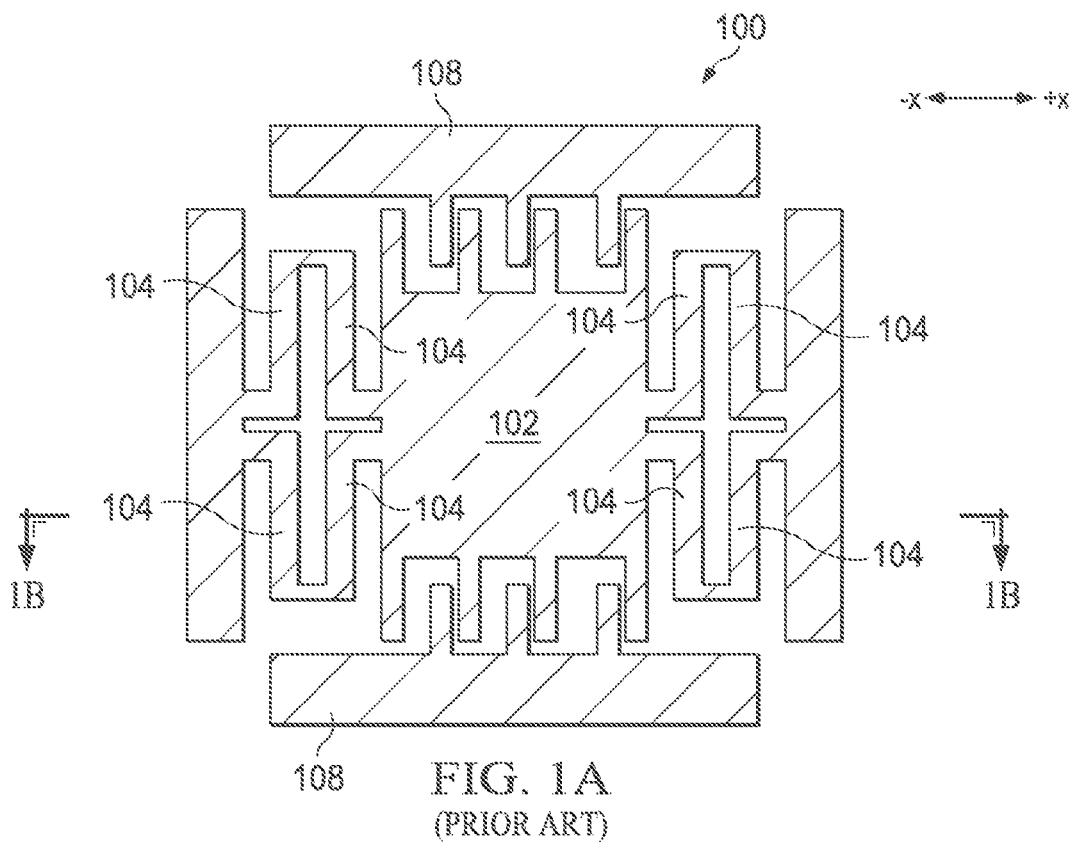
FIGS. 1A and 1B illustrate a top view and a cross-sectional view of a conventional single-direction accelerometer.
Figure 1B:
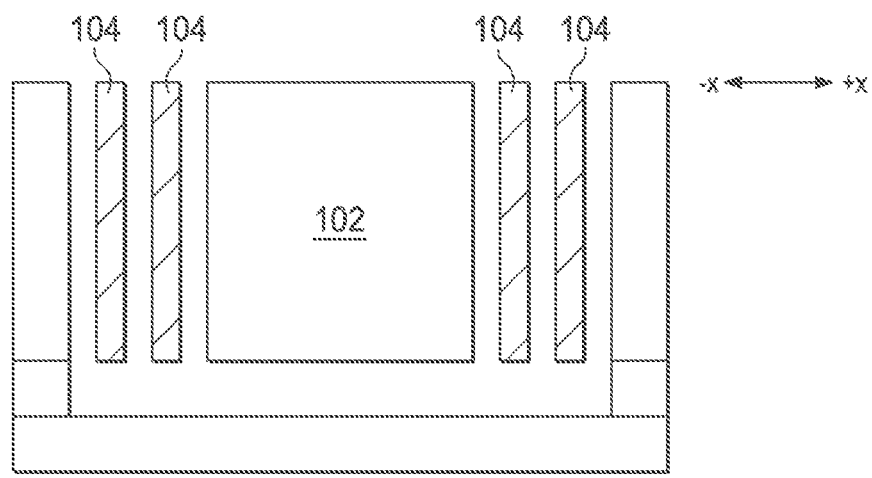
Figure 2:
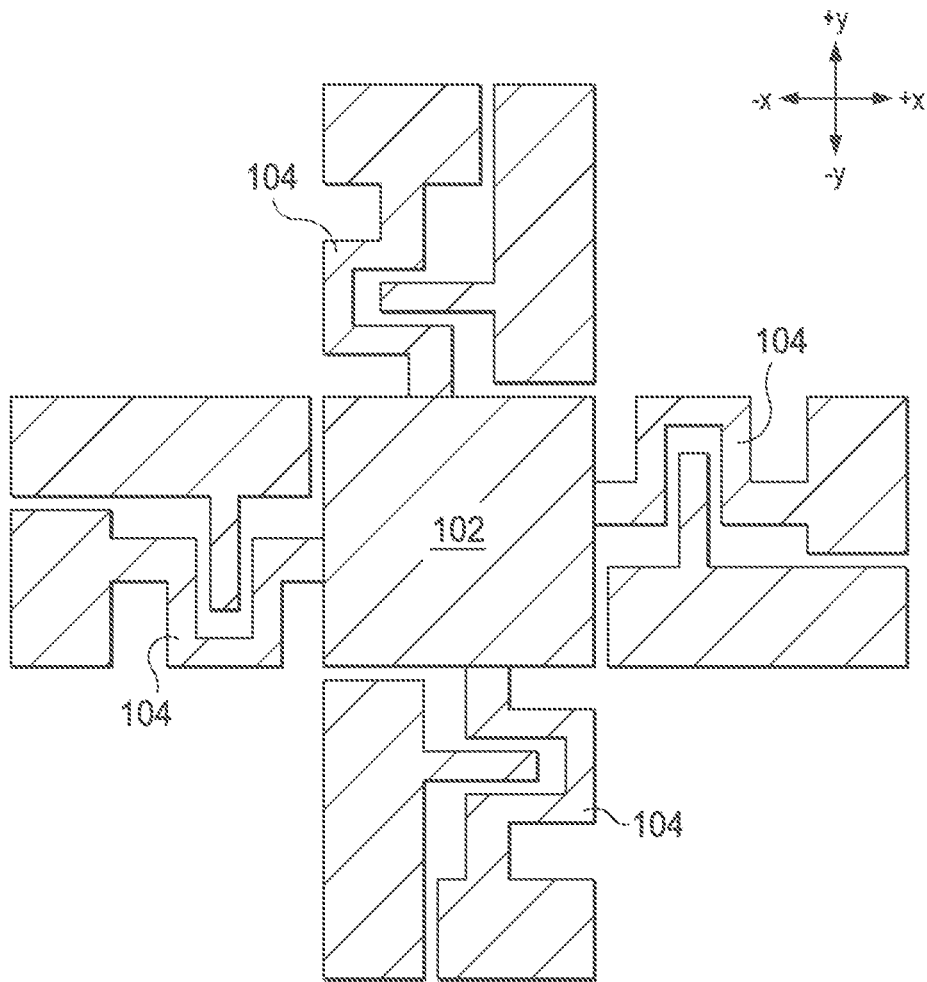
FIG. 2 illustrates a top view of a conventional double-axis accelerometer.
Figure 3:
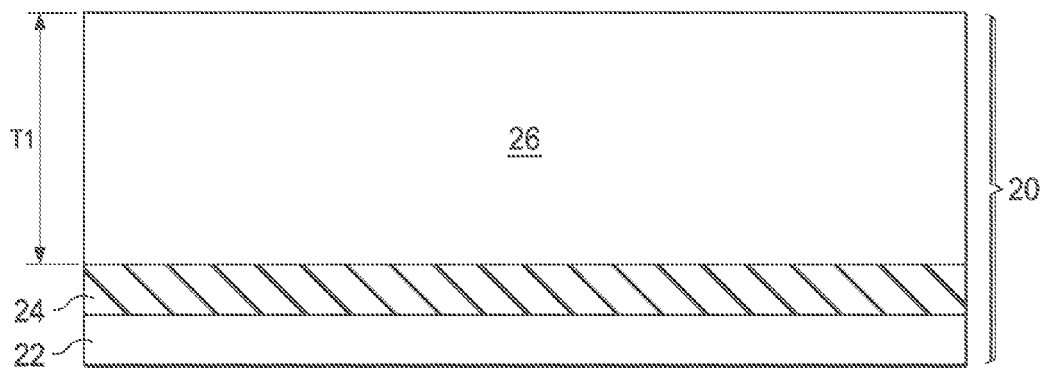
FIGS. 3 through 12 are cross-sectional views of intermediate stages in the manufacturing of a triple-axis accelerometer in accordance with an embodiment.

Referring to FIG. 3, substrate 20 is provided. In an embodiment, substrate 20 is a semiconductor-on-insulator substrate, such as a silicon-on-insulator substrate. Substrate 20 may include bottom semiconductor layer 22, buried oxide layer (BOX) 24, and top semiconductor layer 26. Throughout the description, top semiconductor layer 26 is referred to as (top) silicon layer 26, although it may also be formed of other commonly used semiconductor materials including group III, group IV, and/or group V materials. Thickness T1 of silicon layer 26 may be greater than about 20 μm, and may be about 30 μm, although thickness T1 may also be greater or smaller. Preferably, a portion of silicon layer 26, in which a triple-axis accelerometer is formed, is doped to reduce the resistivity.

Figure 4:
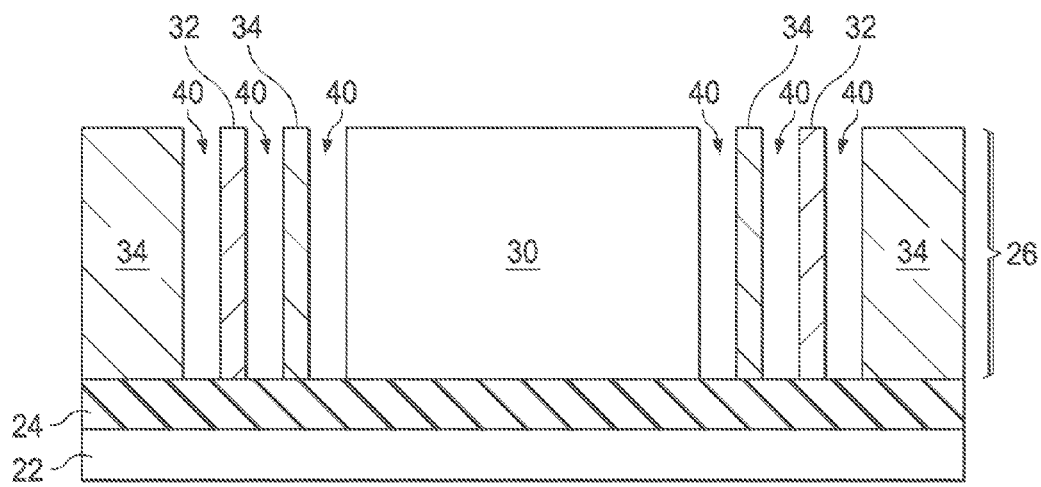
Figure 13:
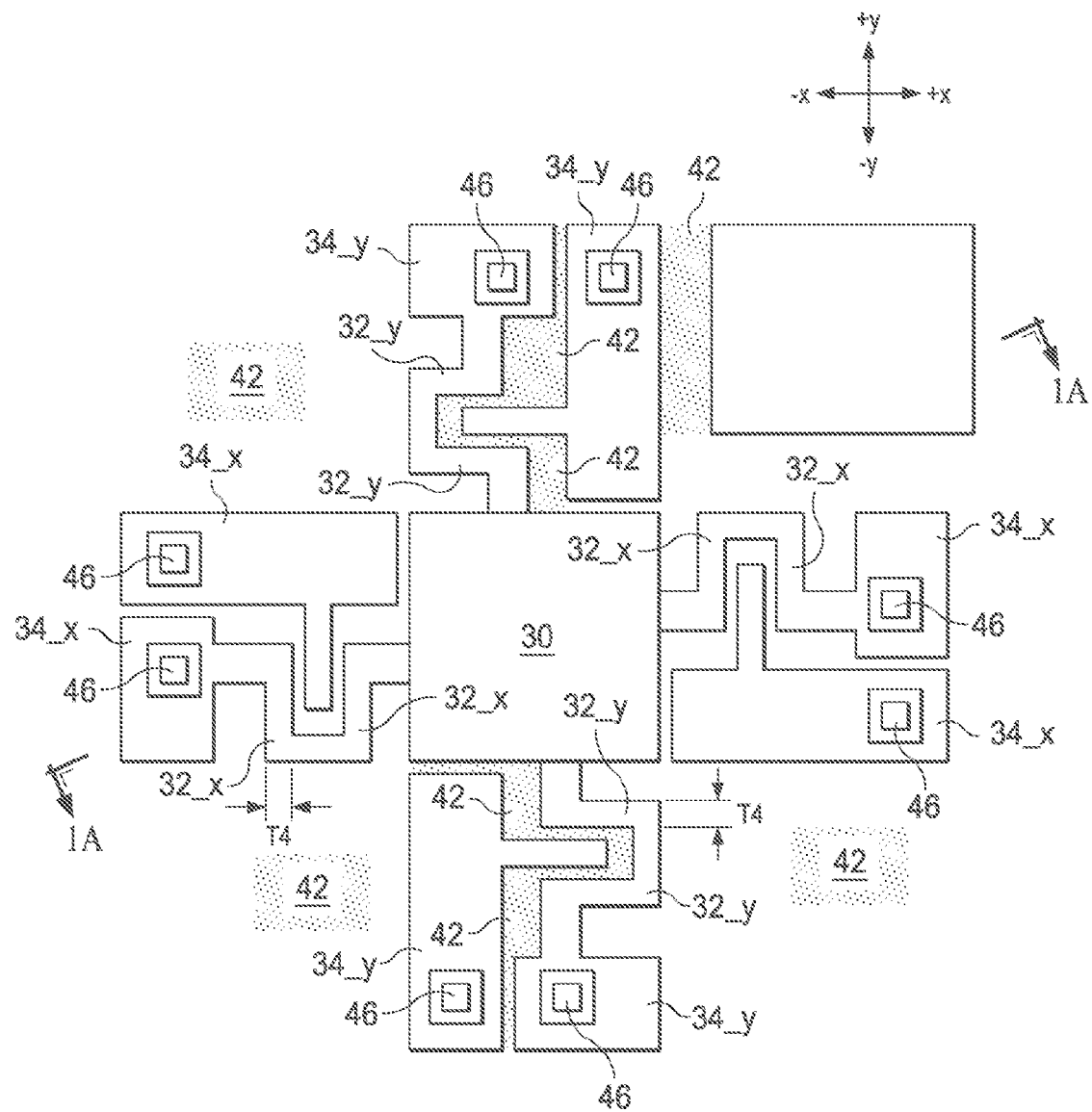
FIGS. 13 and 14 are top views of the triple-axis accelerometer as shown in FIG. 13.
Figure 14:
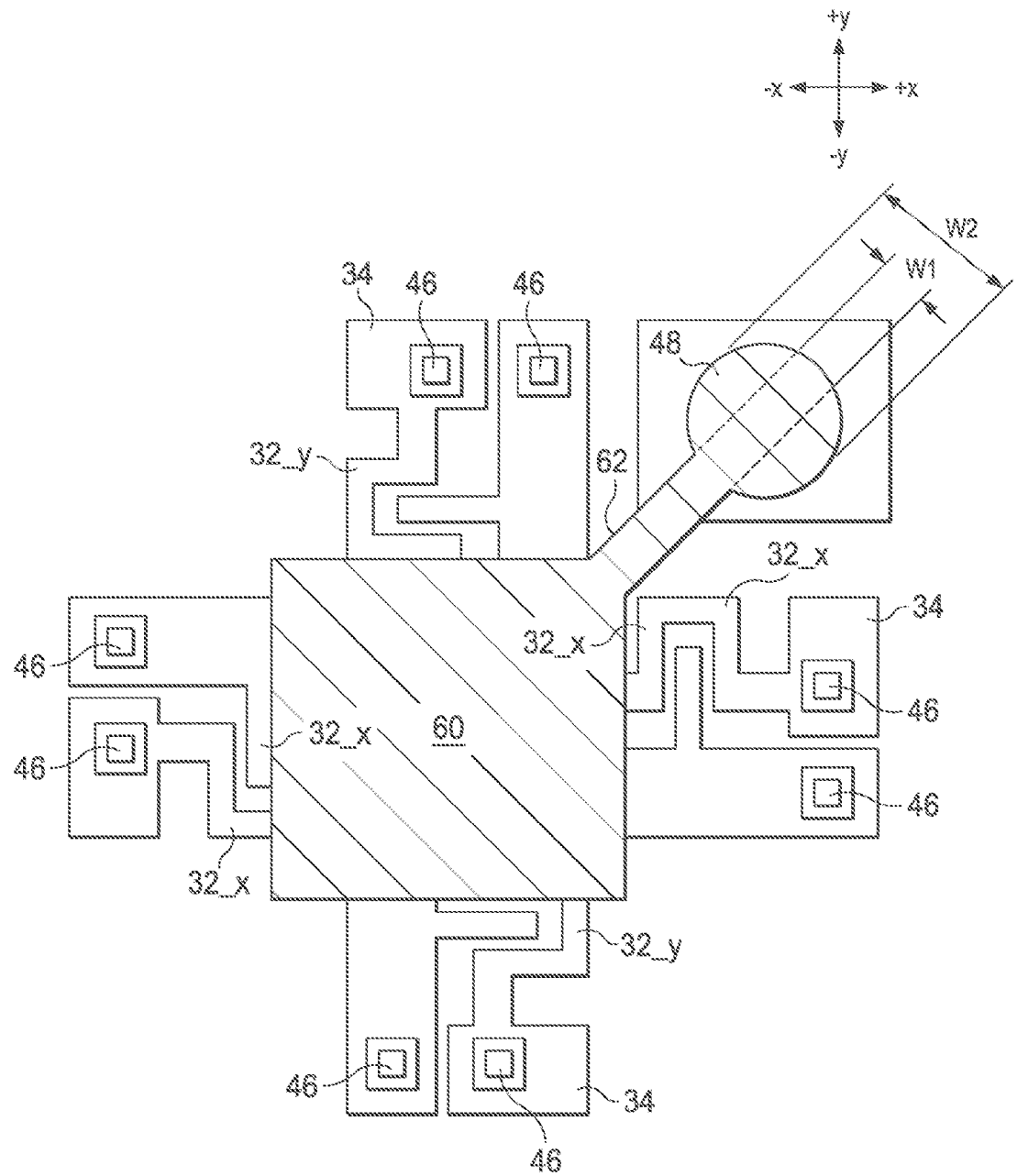

Referring to FIG. 4, a deep silicon etch is performed to define the patterns of proof-mass 30, springs 32 (denoted as 32_x and 32_y in FIG. 13), and capacitor contact regions 34 (denoted as 34_x and 34_y in FIGS. 13 and 14). Recesses 40 are thus formed, through which BOX 24 is exposed. The deep silicon etch may be performed using dry etch such as Bosch type deep Si etching, or deep reactive-ion etching (DRIE) with Fluorine-based gas as an etchant.

Figure 5:
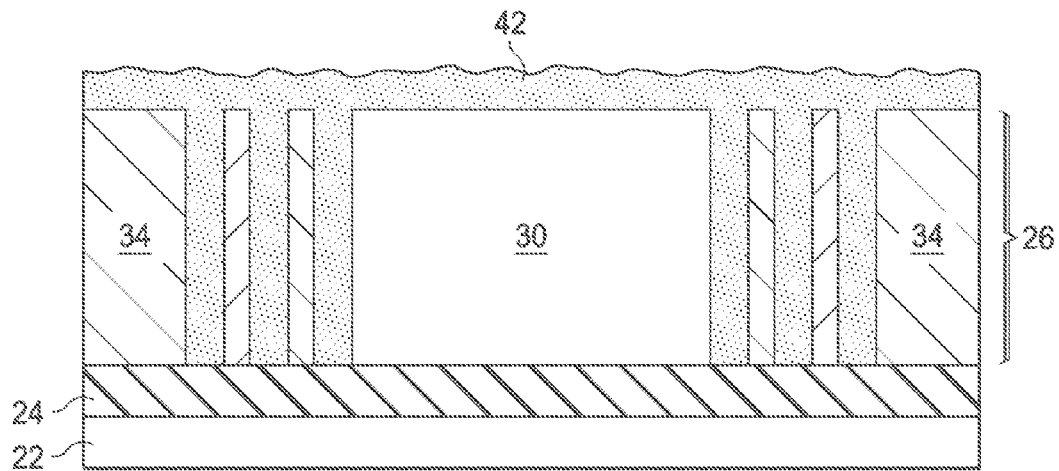
Figure 6:
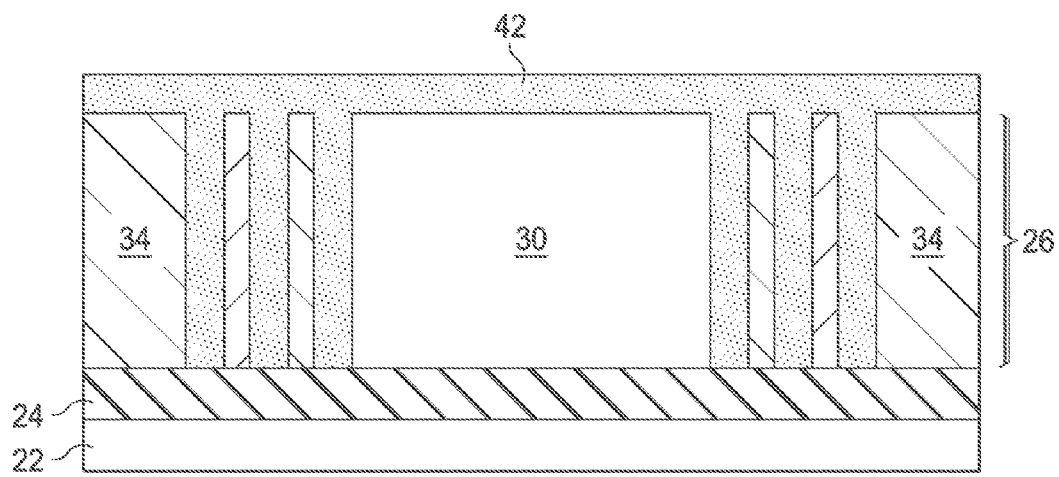
Figure 9:
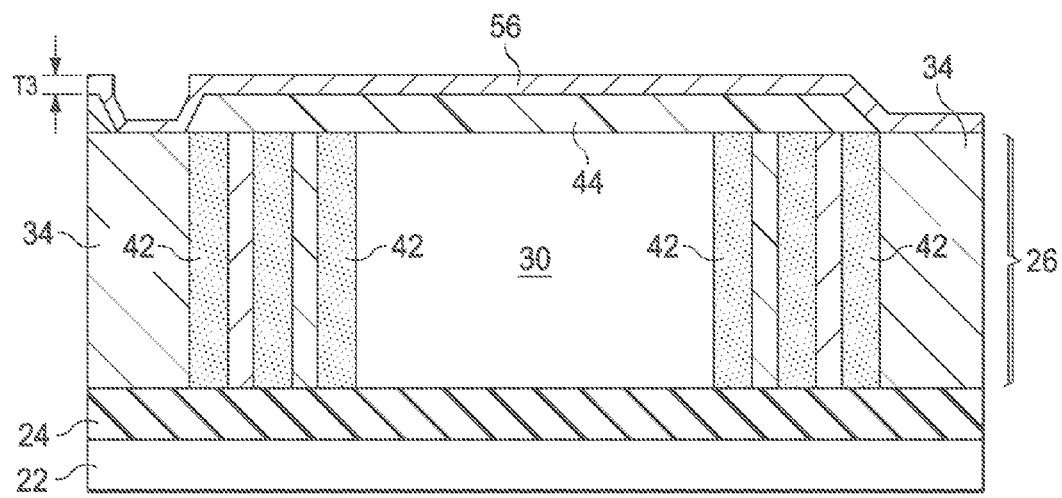

Next, as shown in FIG. 5, filling material 42 is filled into recesses 40 until the top surface of filling material 42 is higher than the top surface of silicon layer 26. In an embodiment, filling material 42 may be an oxide, such as silicon oxide, wherein the filling method includes plasma enhanced chemical vapor deposition (PECVD), although other deposition methods may also be used. In other embodiments, filling material 42 may be any other material that has a high etching selectivity with relative to silicon layer 26 and metal layer 56 as shown in FIG. 9. If the top surface of filling material 42 is too rough for the subsequent process, a chemical mechanical polish (CMP) may be performed, resulting in the structure as shown in FIG. 6. The CMP step may be skipped if the top surface of filling material 42 is substantially leveled.

Figure 7:
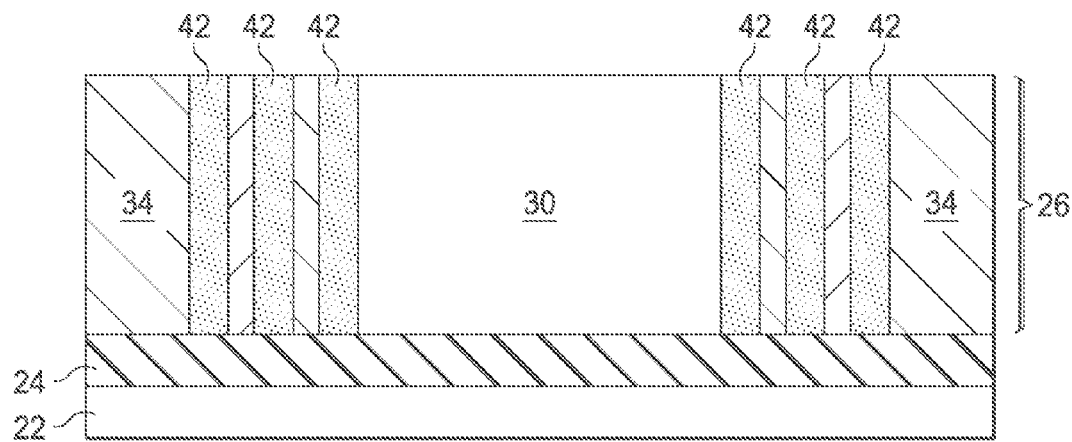

FIG. 7 illustrates the etch back of filling material 42 until the top surface of silicon layer 26 is exposed. During the etch back, no mask layer is needed, although one may be used (for example, if there are other circuits such as metal-oxide-semiconductor (MOS) transistors on silicon layer 26). The top surface of the remaining filling material 42 is preferably leveled with the top surface of silicon layer 26.

Figure 8:
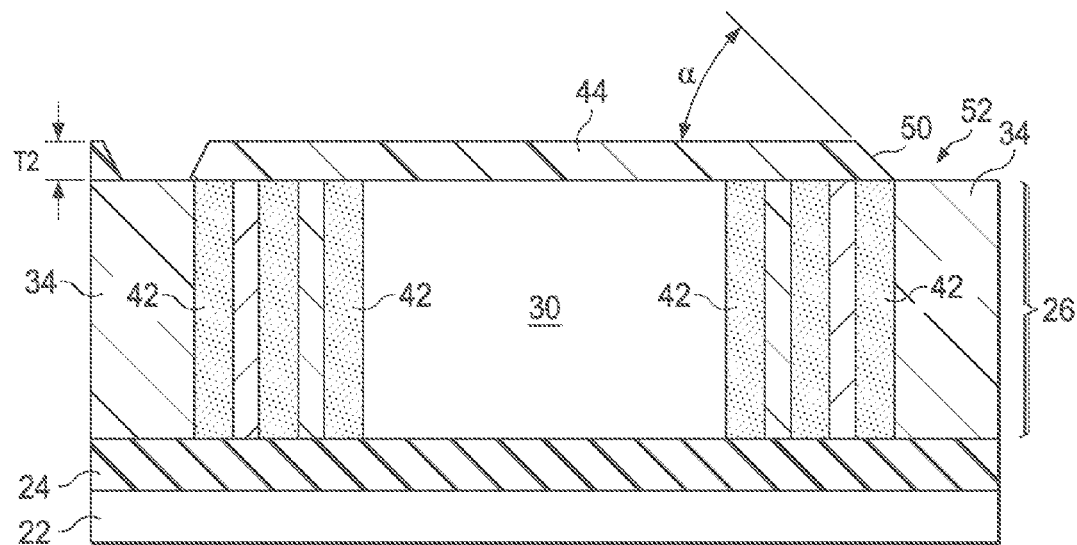
Figure 15:
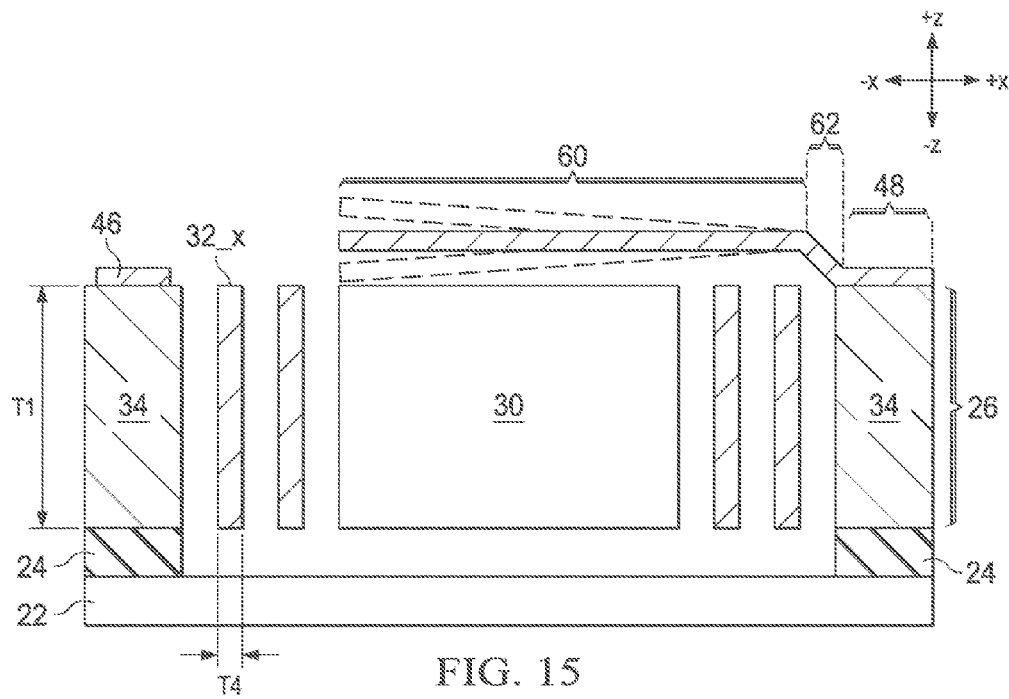
FIG. 15 illustrates the response of the triple-axis accelerometer under a z-direction acceleration.

In FIG. 8, sacrificial layer 44, which may be formed of a photo resist and hence is referred to as photo resist 44, is formed and patterned. Thickness T2 of photo resist 44 may be between about 2 μm and about 4 μm, although a greater or a smaller thickness may be used, depending on the desirable capacitance of the resulting z-direction capacitor and the desirable moving range of the top capacitor plate 60, as is shown in FIG. 15. After the patterning of photo resist 44, the portions of silicon layer 26, on which contact electrodes 46 are formed, are exposed. Further, the portion of silicon layer 26 for forming anchor electrode 48 (refer to FIG. 14) for the capacitor plate of the z-direction capacitor is also exposed (also refer to FIG. 10). Anchor electrode 48 not only anchors capacitor plate 60, but also provides electrical connection to capacitor plate 60.

In an embodiment, sidewall 50 of photo resist 44 adjacent the future anchor electrode 48 (FIG. 10) is slanted. The tilt angle α may be smaller than about 80 degrees, or even smaller than about 75 degrees, or even between about 65 degrees and about 70 degrees. In an exemplary embodiment, slanted sidewall 50 may be formed by defocusing the light used for exposing photo resist 44. For example, in the exposure of photo resist 44, a focus energy matrix may be adopted using different energies and different focuses. As a result, the upper portion of opening 52 in photo resist 44 is greater than the lower portion of opening 52, hence slanted sidewall 50 is formed.

Figure 10:
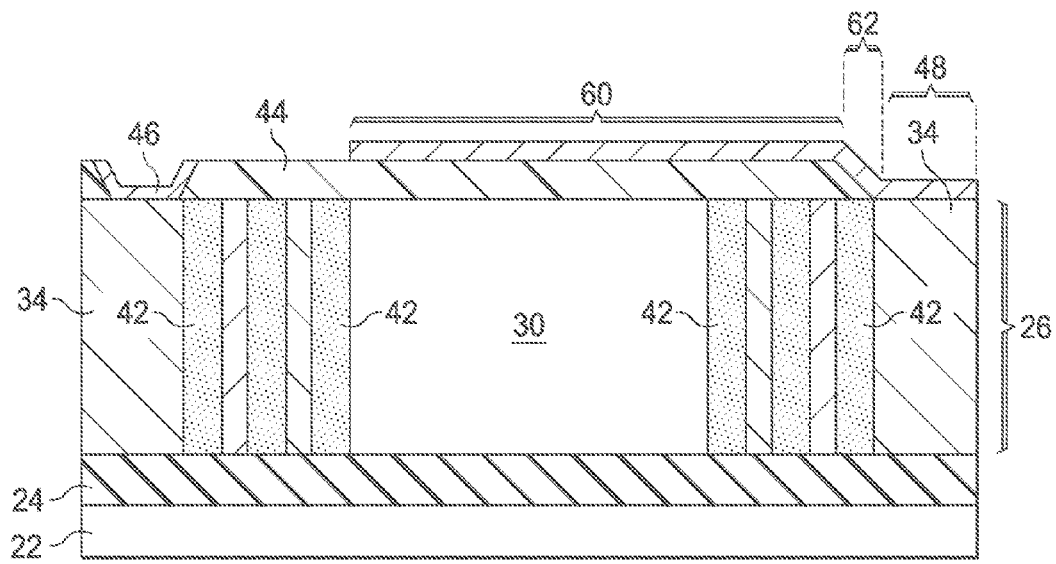

Referring to FIG. 9, metal layer 56 is deposited. In an embodiment, metal layer 56 comprises AlCu, although it may include other metallic material such as silver, gold, tungsten, and combinations thereof. Thickness T3 of metal layer 56 may be less than about 10 μm, and also between about 2 μm and about 5 μm, although a different value may be used depending on, for example, the size of the resulting capacitor plate 60 (not shown in FIG. 9, refer to FIG. 10). Referring to FIG. 10, metal layer 56 is patterned, forming capacitor plate 60, anchor electrode 48, and transition portion 62 connecting capacitor plate 60 to anchor electrode 48. In addition, contact electrodes 46 (also refer to FIG. 14) are formed.

Figure 11:
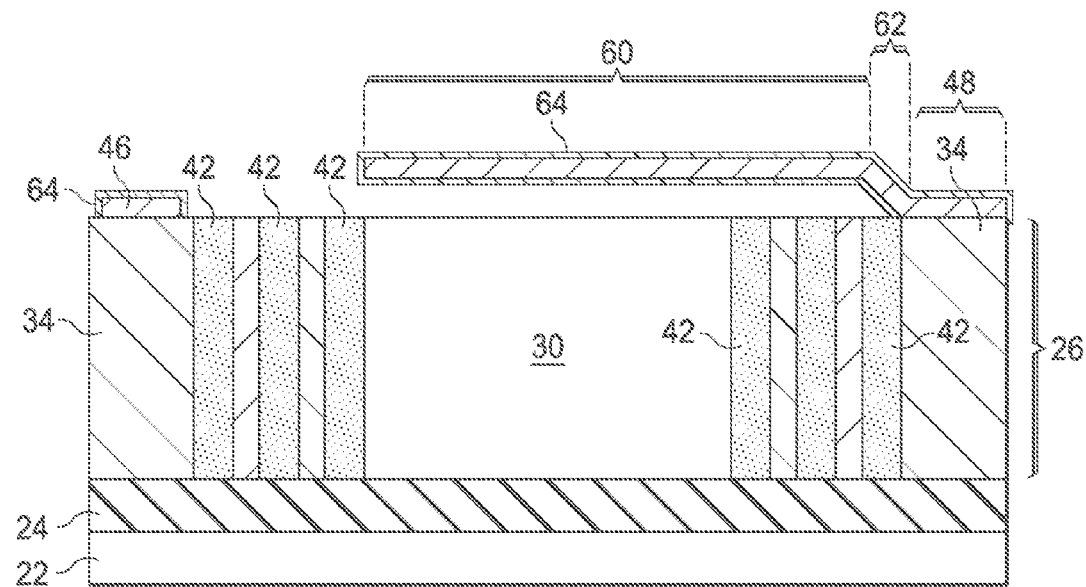
Figure 12:
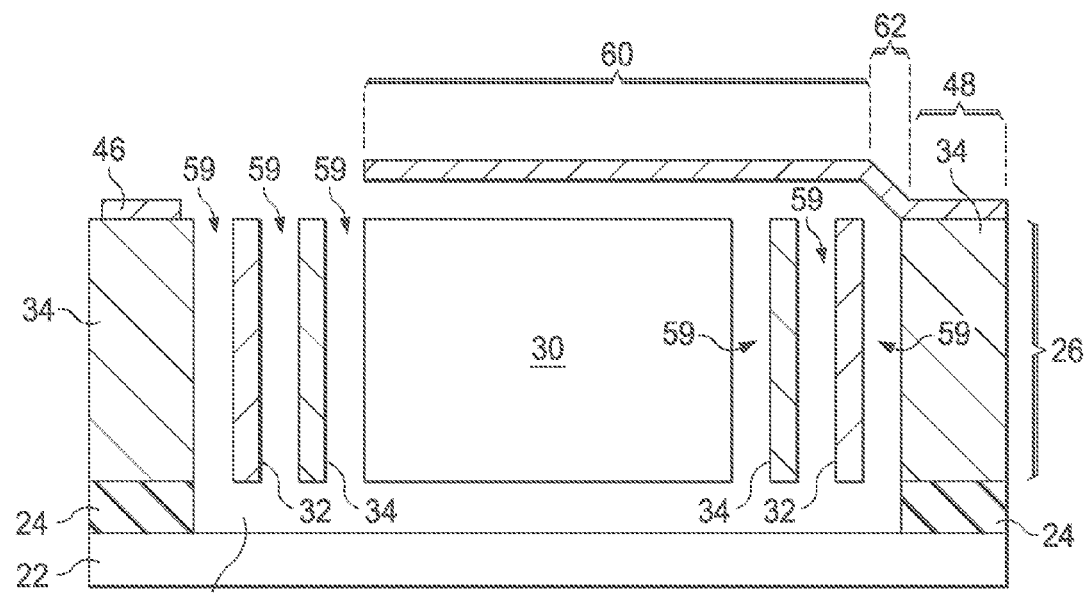

In FIG. 11, photo resist 44 is removed, for example, by an ashing step, which may be performed using oxygen plasma. Optionally, a flash gold protection layer 64 is formed on the exposed surface of capacitor plate 60, anchor electrode 48, and contact electrodes 46. Referring to FIG. 12, filling material 42 is then removed, for example, by using a vapor type HF gas to form air spaces 59. In addition, the portions of BOX 24 underlying proof-mass 30 and springs 32 are also removed, for example, also using the vapor type HF gas if BOX 24 is formed of silicon oxide. Accordingly, air space 61 is formed. For simplicity, the possible undercuts in BOX 22 are not shown.

FIGS. 13 and 14 are top views of the structure as shown in FIG. 12. Capacitor plate 60 is not shown in FIG. 13, but is shown in FIG. 14. It is observed that, proof-mass 30 can be moved in the x directions (+x and −x directions) due to the existence of springs 32_x. Similarly, proof-mass 30 can be moved in y directions (+y and −y directions) due to the existence of springs 32_y. Referring to FIG. 15, in the z directions (the direction perpendicular to the plane parallel to the surface of substrate 20, including +z and −z directions), both proof-mass 30 and capacitor plate 60 can move when experiencing an acceleration. It is realized, however, that since thickness T1 of springs 32_x and 32_y is significantly greater than their horizontal thickness T4, proof-mass 30 may not be sensitive to the z-direction acceleration. However, capacitor plate 60 is formed of metal, and hence has a high flexibility. Accordingly, capacitor plate 60 may move up or down, as shown by the dotted lines, in response to the acceleration. Further, during the acceleration, proof-mass 30 may move (if it moves at all) in a same direction as capacitor plate 60. However, the position shift of capacitor plate 60 is greater than that of proof-mass 30, and the change in the capacitance of the capacitor between capacitor plate 60 and proof-mass 30 is determined by the relative position change of capacitor plate 60 and proof-mass 30. To further increase the z-direction sensitivity of the accelerometer, width W1 of transition portion 62 (FIG. 14) may be smaller than width W2 of anchor electrode 48. In an exemplary embodiment, width W1 is less than about 30 percent of width W2. Further, one end of capacitor plate 60 may be anchored to silicon layer 26 through only one anchor electrode 48 (FIG. 14), although other anchor electrodes may be added. The other end is a free end not anchored. The change of capacitance is used to determine the acceleration. Accordingly, the corresponding accelerometer as shown in FIGS. 13 through 15 is a triple-axis accelerometer.

Figure 16:
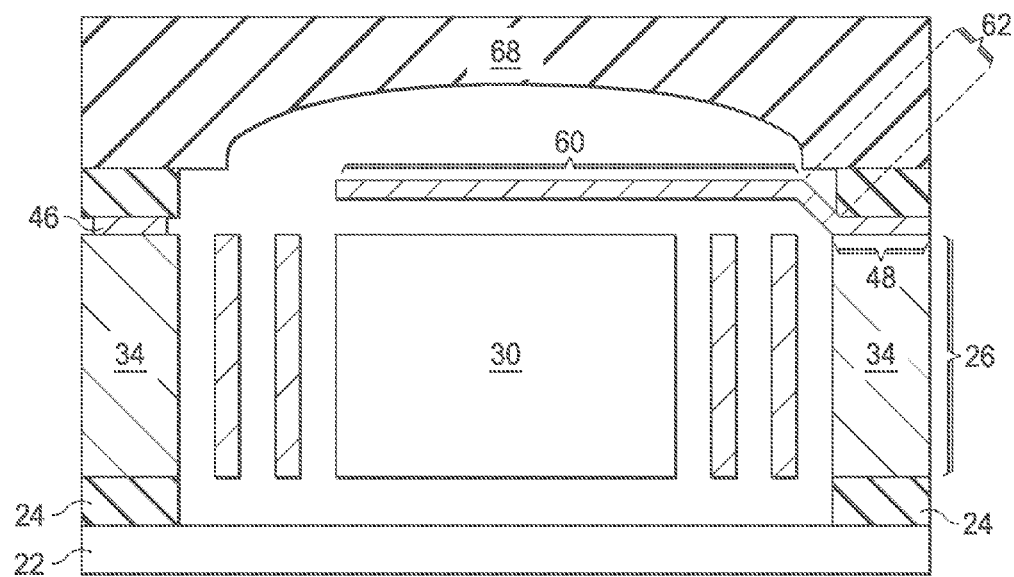
FIG. 16 illustrates a cross-sectional view of the triple-axis accelerometer after the formation of a cap layer.

FIG. 16 illustrates the formation of cap 68, which protects the accelerometer from damage and contamination coming from external environment. The electrical connection to contact electrodes 46 and anchor electrode 48 is also made.

Referring again to FIG. 15, it is realized that during the operation of the triple-axis accelerometer, due to the repeated force applied on capacitor plate 60, there is the possibility of fatigue in capacitor plate 60 and transition portion 62. Particularly, transition portion 62 is likely subject to cracking. However, with the slanted profile of transition portion 62, instead of a vertical profile, the possibility of crack in transition portion 62 is significantly reduced. Further, metal capacitor plate 60 has a higher flexibility than if it is formed of polysilicon. Accordingly, the z-direction sensitivity of the accelerometer is increased, accompanied by the improvement in the resistance to crack.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method comprising:
   patterning a semiconductor layer to form a proof-mass, a spring connected to the proof-mass, and a capacitor contact region connected to the spring; and
   forming a metal capacitor plate electrically coupled to the capacitor contact region, wherein the metal capacitor plate extends overlapping the proof-mass to form a capacitor with the proof-mass, and the metal capacitor plate comprises:
      a first portion in contact with the capacitor contact region;
      a second portion overlapping the proof-mass and at a level higher than the first portion; and
      a transition portion connecting the first portion to the second portion, wherein the transition portion is slanted, and is not perpendicular to the first portion and the second portion.

2. The method of claim 1, wherein the step of forming the metal capacitor plate comprises:
   forming a sacrificial layer covering the proof-mass and the spring, wherein a portion of the capacitor contact region is exposed through the sacrificial layer;
   depositing a metal layer over the sacrificial layer and the capacitor contact region, wherein the metal layer contacts the capacitor contact region;
   patterning the metal layer to form the metal capacitor plate; and
   removing the sacrificial layer.

3. The method of claim 2, wherein the method of forming the sacrificial layer comprises applying and patterning a photo resist, and wherein the step of patterning the photo resist comprises exposing the photo resist by defocusing a light used for exposing the photo resist.

4. The method of claim 2, wherein the sacrificial layer comprises an opening, wherein the capacitor contact region is exposed through the opening, and wherein a sidewall of the sacrificial layer exposed to the opening is slanted.

5. The method of claim 2, wherein the forming the sacrificial layer comprises applying a photo resist.

6. The method of claim 1 further comprising:
   after the step of patterning the semiconductor layer and before the step of forming the metal capacitor plate, filling a filling material into spaces between the proof-mass, the spring, and the capacitor contact region; and
   after the metal capacitor plate is formed, removing the filling material.

7. A method comprising:
   patterning a top semiconductor layer to form a proof-mass, springs connected to the proof-mass, and capacitor contact regions, wherein the top semiconductor layer is comprised in a substrate comprising a bottom semiconductor layer, a buried dielectric layer over the bottom semiconductor layer, and the top semiconductor layer over the buried dielectric layer, and wherein the proof-mass and the springs are spaced apart from the capacitor contact regions by air spaces; and
   forming a metal capacitor plate electrically connected to one of the capacitor contact regions, wherein the metal capacitor plate comprises:
      a first portion overlapping, and spaced apart from, the proof-mass to form a capacitor with the proof-mass;
      a second portion lower than the first portion and physically contacting the one of the capacitor contact regions; and
      a transition portion connecting the first portion to the second portion, wherein the transition portion comprises a metal, and is slanted.

8. The method of claim 7, wherein the step of forming the metal capacitor plate comprising:
   forming a sacrificial layer over the top semiconductor layer;
   patterning the sacrificial layer, wherein a remaining portion of the sacrificial layer covers the proof-mass and comprises a slanted sidewall, and wherein one of the capacitor contact regions is exposed through the sacrificial layer and adjoining the slanted sidewall;
   after the step of patterning the sacrificial layer, depositing a metal layer on the sacrificial layer; and
   patterning the metal layer to form the metal capacitor plate.

9. The method of claim 8, wherein the sacrificial layer comprises a photo resist.

10. The method of claim 7 further comprising, after the step of forming the metal capacitor plate, removing portions of the buried dielectric layer directly underlying the proof-mass and the springs.

11. The method of claim 7 further comprising;
    after the step of patterning the top semiconductor layer, filling a material into the air spaces; and
    after the step of forming a metal capacitor plate, removing the material from the air spaces.

12. The method of claim 7, wherein the transition portion of the metal capacitor plate forms a slant angle with a top surface of the top semiconductor layer, with the slant angle being less than about 80 degrees.

13. The method of claim 7, wherein a thickness of the metal capacitor plate is thin enough to allow the first portion of the metal capacitor plate to have a first position shift greater than a second position shift of the proof-mass.

14. A method comprising:
    providing a substrate comprising a bottom semiconductor layer, a buried dielectric layer over the bottom semiconductor layer, and a top semiconductor layer over the buried dielectric layer;
    patterning the top semiconductor layer until the buried dielectric layer is exposed, wherein remaining portions of the top semiconductor layer comprise a proof-mass, springs connected to the proof-mass, and capacitor contact regions, and wherein the proof-mass and the springs are spaced apart from the capacitor contact regions by air spaces;
    filling a filling material into the air spaces, wherein the filling material has a top surface substantially level with a top surface of the top semiconductor layer;
    forming a sacrificial layer over the top semiconductor layer;
    patterning the sacrificial layer, wherein a remaining portion of the sacrificial layer covers the proof-mass, and wherein the remaining portion comprises a slanted sidewall;
    after the step of patterning the sacrificial layer, depositing a metal layer on the sacrificial layer;
    patterning the metal layer to form a metal capacitor plate comprising:

a first portion directly over, and spaced apart from, the proof-mass;
a second portion contacting one of the capacitor contact regions; and
a transition portion on the slanted sidewall of the sacrificial layer and connecting the first portion to the second portion; and
removing the sacrificial layer, the filling material, and portions of the buried dielectric layer directly underlying the proof-mass and the springs.

15. The method of claim 14, wherein the slanted sidewall of the sacrificial layer has a slant angle of less than about 80 degrees.

16. The method of claim 14, wherein the sacrificial layer comprises photo resist.

17. The method of claim 14, wherein the metal layer comprises aluminum copper.

18. The method of claim 14, wherein the metal layer has at a thickness less than about 10 μm.

19. The method of claim 14 further comprising, before the step of removing the filling material and after the step of removing the sacrificial layer, forming a flash gold layer on the metal layer.

20. The method of claim 14, wherein the transition portion has a width smaller than a width of the second portion of the metal capacitor plate.

* * * * *